United States Patent
Chou et al.

(10) Patent No.: US 6,995,089 B2
(45) Date of Patent: Feb. 7, 2006

(54) METHOD TO REMOVE COPPER WITHOUT PATTERN DENSITY EFFECT

(75) Inventors: Shih-Wei Chou, Taipei (TW); Minghsing Tsai, Taipei (TW); Winston Shue, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 207 days.

(21) Appl. No.: 10/434,741

(22) Filed: May 8, 2003

(65) Prior Publication Data

US 2004/0224509 A1   Nov. 11, 2004

(51) Int. Cl.
 *H01L 21/302* (2006.01)
(52) U.S. Cl. ............... 438/691; 438/692; 438/695; 438/745
(58) Field of Classification Search ........... 438/691, 438/692, 693, 626, 627, 628, 631, 633, 675, 438/745, 754
See application file for complete search history.

(56) References Cited

U.S. PATENT DOCUMENTS

| | | | |
|---|---|---|---|
| 5,091,339 A | | 2/1992 | Carey .................. 437/187 |
| 5,486,234 A | * | 1/1996 | Contolini et al. ........... 216/91 |
| 6,107,186 A | | 8/2000 | Erb .................... 438/633 |
| 6,157,081 A | * | 12/2000 | Nariman et al. ........... 257/752 |
| 6,319,384 B1 | | 11/2001 | Taylor et al. ............ 205/103 |
| 6,329,234 B1 | | 12/2001 | Ma et al. ............... 438/210 |
| 6,368,955 B1 | * | 4/2002 | Easter et al. ............ 438/633 |
| 6,475,909 B2 | * | 11/2002 | Uozumi ................. 438/678 |
| 6,525,425 B1 | * | 2/2003 | Woo et al. .............. 257/758 |

\* cited by examiner

*Primary Examiner*—Lan Vinh
(74) *Attorney, Agent, or Firm*—Haynes and Boone, LLP

(57) ABSTRACT

A new method is provided that allows for the application of electropolish for removal of copper and that is independent of pattern density of the removed copper. Electropolish of the copper is first accomplished by reversing current in the $H_2SO_4$ or $H_3PO_4$ solution. After identifying the endpoint of the electropolish, chemical etching of the copper in a $H_2SO_4$ or $H_3PO_4$ solution is continued, in this manner avoiding effects of high current density introduced by pattern density.

40 Claims, 2 Drawing Sheets

METHOD TO REMOVE COPPER WITHOUT PATTERN DENSITY EFFECT

BACKGROUND OF THE INVENTION (1) Field of the Invention

The invention relates to the fabrication of integrated circuit devices, and more particularly, to a method for polishing copper surfaces by using electropolish without thereby incurring negative effects of low-k dielectric peeling and surface dishing.

(2) Description of the Prior Art

A significant aspect of the creation of semiconductor devices addresses the interconnection of these devices. For these interconnections, metals such as aluminum or their alloys have been used extensively in the past. In more recent developments copper is becoming the preferred material for the creation of metal interconnects. Copper has of late been the material of choice in view of the more attractive performance characteristics of copper such as low cost and low resistivity. Copper however has a relatively large diffusion coefficient into surrounding dielectrics such as silicon dioxide and silicon. Copper that forms a conductive interconnect may diffuse into the surrounding dielectric, causing the dielectric to be conductive and decreasing the dielectric strength of the silicon dioxide layer.

Copper interconnects are therefore preferably encapsulated by at least one diffusion barrier to prevent diffusion into the surrounding dielectric layer. Silicon nitride is a diffusion barrier to copper, but the prior art teaches that the interconnects should not lie on a silicon nitride layer because it has a high dielectric constant compared with silicon dioxide. The high dielectric constant causes an undesired increase in capacitance between interconnects and the substrate. Copper further has low adhesive strength to various insulating layers, while it has been proven inherently difficult to mask and etch a blanket copper layer into intricate circuit structures.

While copper has become important for the creation of multilevel interconnections, copper lines frequently show damage after Chemical Mechanical Polishing (CMP) and clean. This in turn causes problems with planarization of subsequent layers that are deposited over the copper lines, since these layers may now be deposited on a surface of poor planarity. Isolated copper lines or copper lines that are adjacent to open fields are susceptible to damage. Poor copper gap fill together with subsequent problems of etching and planarization are suspected as the root causes for these damages. Where over-polish is required, the problem of damaged copper lines becomes even more severe.

The increasing need to form planar surfaces in semiconductor device fabrication has led to the development of a process technology known as Chemical Mechanical Planarization (CMP). In the CMP process, semiconductor substrates are rotated, face down, against a polishing pad in the presence of abrasive slurry. Most commonly, the layer to be planarized is an electrical insulating layer overlaying active circuit devices. As the substrate is rotated against the polishing pad, the abrasive force grinds away the surface of the insulating layer. Additionally, chemical compounds within the slurry undergo a chemical reaction with the components of the insulating layer to enhance the rate of removal. By carefully selecting the chemical components of the slurry, the polishing process can be made more selective to one type of material than to another. For example, in the presence of potassium hydroxide, silicon dioxide is removed at a faster rate than silicon nitride. The ability to control the selectivity of a CMP process has led to its increased use in the fabrication of complex integrated circuits.

Conventional methods of Chemical Mechanical Polishing (CMP) are known to cause problems of peeling of the surrounding low-k dielectric and of dishing and corrosion of the polished copper surface. As an alternative to CMP, the process of electropolish is gaining increased acceptance. Polishing results that are obtained by applying electropolish however are affected by a density effect, whereby isolated lines are stripped at a much higher rate due to the higher current density carried by the isolated lines. The invention addresses these issues.

U.S. Pat. No. 5,091,339 (Carey) shows a copper removal process.

U.S. Pat. No. 6,319,384 B1 (Taylor et al.) shows a pulse reverse electro deposition process.

U.S. Pat. No. 6,329,324 (Ma et al.) shows a copper etchback planarization process.

U.S. Pat. No. 6,107,186 (Erb) shows a copper planarization process.

SUMMARY OF THE INVENTION

A principle objective of the invention is to remove copper without thereby being affected by pattern density of the removed copper.

Another objective of the invention is to apply the process of electropolish such that pattern density of the removed copper is eliminated as an influencing factor.

In accordance with the objectives of the invention a new method is provided that allows for the application of electropolish for removal of copper and that is independent of pattern density of the removed copper. Electropolish of the copper is first accomplished by reversing current in a $H_2SO_4$ or $H_3PO_4$ solution. After identifying the endpoint of the electropolish, chemical etching of the copper in the $H_2SO_4$ or $H_3PO_4$ solution is continued, in this manner avoiding effects of high current density introduced by pattern density.

DESCRIPTION OF THE PREFERRED EMBODIMENTS

Polishing of copper surfaces using methods of CMP has a number of disadvantages such as surface scratch, surface dishing and delamination of a surrounding layer of low-k dielectric. For these and other reasons, electropolish is emerging as a technology to replace conventional copper CMP processes.

Electropolish provides a recent and more accurate alternative to mechanical smoothing and de-burring by providing a variety of services including stainless steel fabrication, clean room packaging and the like. The electropolish process removes oxides and impurities from surfaces and leaves a sterile and passive finish.

Electropolish as an alternative to conventional processes of CMP offers potential advantages that can be gained by completely or partially removing the CMP process for purposes of polishing copper surfaces. These advantages can be summarized as follows:

by allowing a thinner layer of copper over the active surface of a substrate, the throughput of the copper CMP process is increased concerns of low-k dielectric delamination or peeling are reduced, thereby reducing the polishing time decreased or no over-polish is made possible, resulting in potential reduction of copper surface dishing and erosion a planar copper surface is more readily achieved, reducing dishing of wide copper trenches, and by allowing for the deposition of a thin layer of copper over stacked vias, the concern of thermal stability of the stacked vias is reduced.

Using conventional processing, copper can be deposited overlying a seed layer using Electro Chemical Plating (ECP). Typical ECP processing parameters are as follows: temperature between about 15 and 50 degrees, the source of deposition of the $H_2SO_4$ is the dilution of $H_2SO_4$, $CuSO_4$ and HCl with a deposition flow rate of between about 5K and 50 liters/minute and a deposition time of between about 1 and 30 minutes, the voltage applied to the anode between about 0.1 and 20 volts and the voltage applied to the cathode between about 0.1 and 20 volts.

Electropolish is a reverse plating process and is used to remove copper by reversing current flow. The electropolish process can be used in-situ and in combination with the ECP process.

The invention will now be explained using FIGS. 1 through 4 for this purpose.

Figure 1:
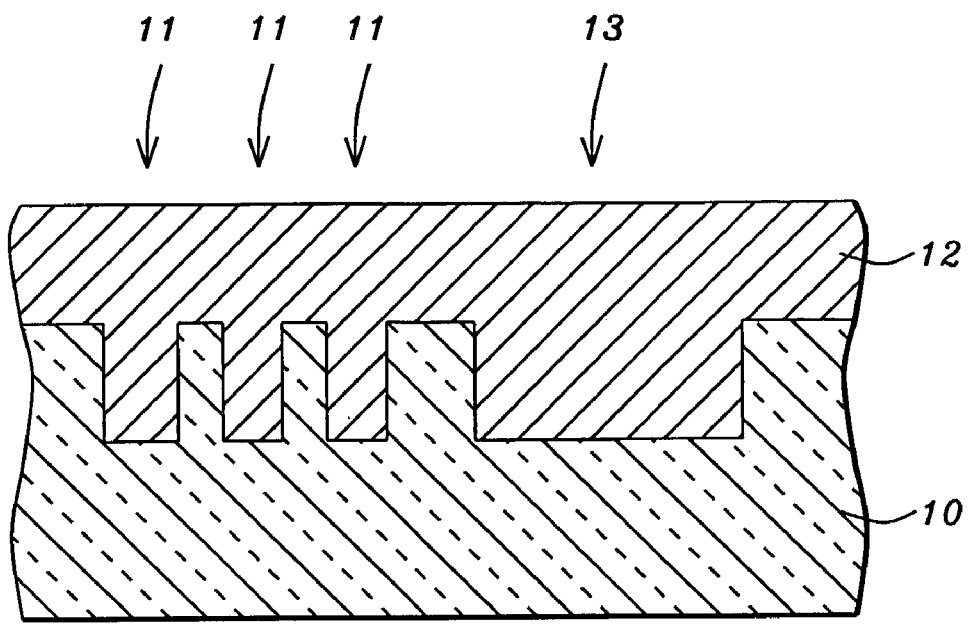
FIG. 1 shows a cross section of a pattern of copper interconnect.

Referring first specifically to the cross section that is shown in FIG. 1, there is shown the cross section of a layer 10 of dielectric in the surface of which an (arbitrary) pattern has been created, the pattern created in the surface of layer 10 of dielectric is filled with a layer 12 of copper. The layer 12 of copper overlies the surface of dielectric layer 10 as shown in the cross section of FIG. 1. The layer 12 of copper has been deposited using conventional methods of metal deposition including ECP.

It must be noted in the cross section that is shown in FIG. 1 that for purposes of observing density effects of the created pattern and the therein deposited layer of copper, the pattern that has been created in the surface of layer 10 of dielectric has one wide trench 13 and a dense pattern 11 of trenches. The density effect will become more obvious in observing the cross section that is shown in FIG. 2.

After layer 12 of copper has been deposited, this layer must be planarized for which conventionally CMP is applied. The invention provides a new method for this purpose.

Figure 2:
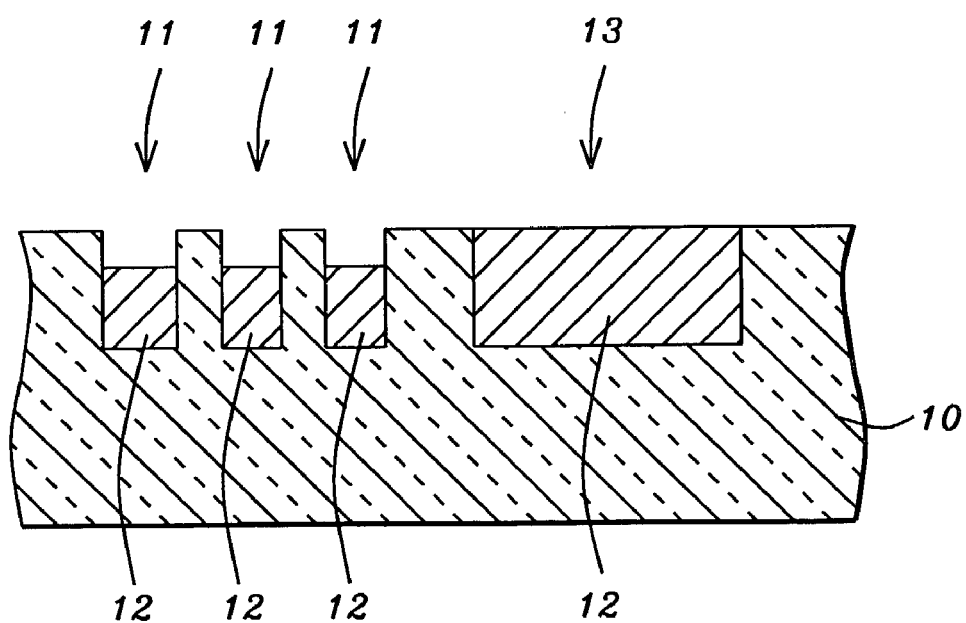
FIG. 2 shows a cross section of the results that are obtained after full electropolish has been applied to the copper interconnect pattern.

The cross section of FIG. 2 shows the results that are obtained by full electropolish being applied to the deposited layer 12 of copper. With full electropolish is meant electropolish to the point where the surface of the copper that fills trench 13 is equal to the surface of the layer 10 of dielectric. At this point and due to the fact that the electropolish current has a higher density in the trenches 11, the copper in trenches 11 will be removed at a faster rate and to below the surface of the layer 10 of dielectric, as shown in the cross section of FIG. 2.

From the cross section that is shown in FIG. 2 it is clear that the pattern density affects the rate of electropolish. The isolated lines that have been created in trenches 11 will be stripped at a much higher rate than the copper deposited in trench 13 due to the fact that the isolated lines carry a higher current density.

Figure 3:
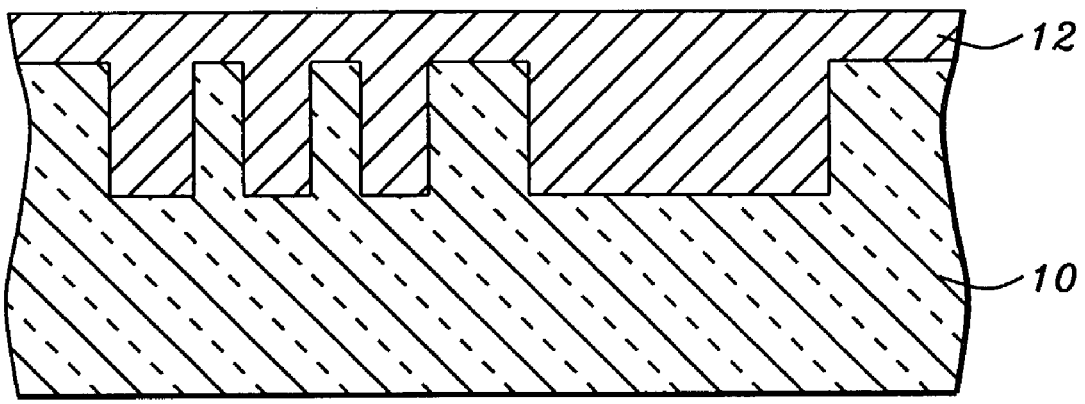
FIG. 3 shows a cross section of the results that are obtained after partial electropolish has been applied to the copper interconnect pattern.

The invention therefore provides for, as shown in the cross section of FIG. 3, a partial electropolish, whereby the layer 12 of copper is removed to the point where a layer 12 of copper remains in place overlying the surface of dielectric 10 to a thickness. This thickness of the remaining and overlying layer 12 of copper is preferable between about 150 and 1,000 Angstrom, an objective that can be accomplished by making the electropolish a timed polish with current control. In addition, the process of electropolish is known to result in a smooth surface of the completed layer 12 of copper that is shown in cross section in FIG. 3.

Figure 4:
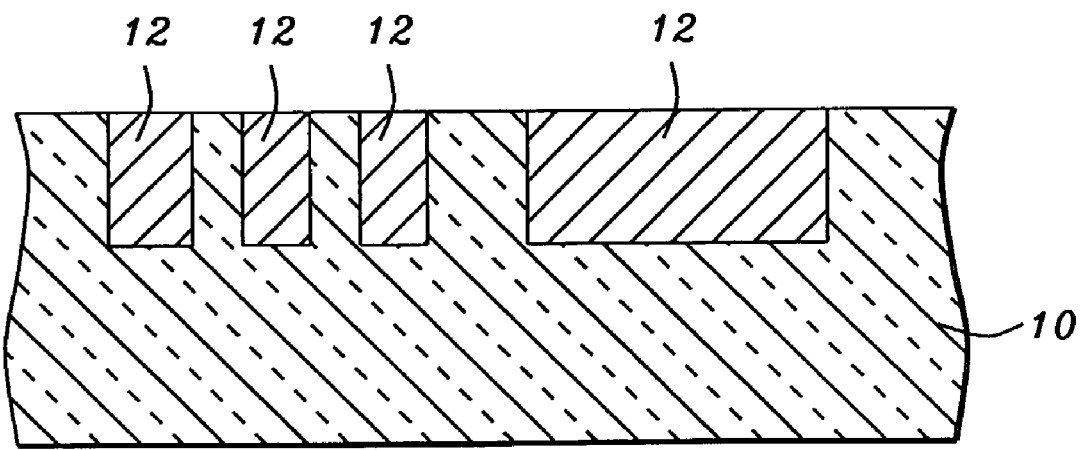
FIG. 4 shows a cross section after a chemical etch back of the surface of the layer of copper interconnect that previously has been partially removed by partial electropolish.

To complete the removal of the layer 12 of copper from above the surface of layer 10 of dielectric, a chemical etch back is applied to the surface of layer 12 shown in cross section in FIG. 3, resulting in a final cross section as shown in FIG. 4. The chemical etchback that is applied to the surface of layer 12 of copper, FIG. 3, is preferred to be a timed etchback. The chemical etchback is preferred using $H_3PO_4$ or $H_2SO_4$ as an etchant with a concentration of 85% mixed with citric acid at between 0 and 10,000 ppm. This etchback has an etch rate of between about 20 nm/minute and 60 nm/minute, an etch rate that can be further controlled by the etch temperature.

Because the chemical etchback of layer 12 of FIG. 3 is applied to a relatively thin layer of copper, a layer having the preferred previously stated thickness between about 150 and 1,000 Angstrom, surface roughness of this layer is not affected. If the layer 12 of copper is removed by only applying a chemical etchback, starting with a cross section of this layer 12 as shown in FIG. 1, the surface of the layer of copper after this chemical etchback has a rough texture and is therefore of an unacceptable planarity. In addition, this complete chemical etchback is very time-consuming and is therefore a throughput detractor.

The invention, of applying electropolish that eliminates problems of pattern density conventionally experienced, comprises two steps:
1. partial electropolish of the deposited layer of copper, followed by
2. chemical etchback.

For the layer 12 of metal can be used copper, also used can be doped copper with as doping element Ti, Zr, Zn, Sn and Mg. The two steps of the invention may further be applied with or without the use of a seed layer for the deposited layer of copper or doped copper. In addition, the second step of chemical etchback may be applied as a continuation of the first step of partial electropolish, using the same etchback solution of $H_3PO_4$ or $H_2SO_4$.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for removal of interconnect metal, comprising steps of:

providing a pattern of openings in a layer of dielectric;

depositing a layer of interconnect metal over said layer of dielectric and in said pattern of openings;

first removing said layer of interconnect metal by a first thickness, leaving a layer of interconnect metal having a second thickness of between about 150 and 1000 Angstroms in place over the unpatterned portion of said dielectric, said first removing comprising electropolish; and second removing said layer of interconnect metal having a second thickness from said unpatterned portion of the layer of dielectric, said second removing comprising a chemical etchback.

2. The method of claim 1, wherein said layer of interconnect metal comprises copper.

3. The method of claim 1, wherein said first removing said layer of interconnect metal comprises endpoint detection.

4. The method of claim 1, wherein said first and second removing said layer of interconnect metal are performed using a same chemical solution.

5. The method of claim 1, wherein said first and second removing said layer of interconnect metal comprises exposing said layer of interconnect metal to a $H_2SO_4$ solution.

6. The method of claim 1, wherein said first and second removing said layer of interconnect metal comprises exposing said layer of interconnect metal to a $H_3PO_4$ solution.

7. The method of claim 1, further comprising applying a layer of metal interconnect seed material prior to said depositing a layer of interconnect metal over said layer of dielectric and in said pattern of openings.

8. The method of claim 1, wherein said layer of interconnect metal comprises doped copper having a doping agent.

9. The method of claim 8, wherein said doping agent is Ti, Zr, Zn, Sn or Mg.

10. A method of removing copper, comprising the steps of:

providing a substrate, the substrate having been provided with a layer of dielectric over the surface thereof, a pattern of openings having been created in said layer of dielectric;

depositing a layer of copper over said layer of dielectric and in said openings;

first removing said copper layer by a first thickness, leaving a layer of copper having a second thickness of between about 150 and 1000 Angstroms in place over the unpatterned portion of said dielectric, said first removing comprising electropolishing; and second removing said copper layer having a second thickness from the unpatterned portion of said layer of dielectric, said second removing comprising chemical etchback.

11. The method of claim 10, wherein said first removing said copper layer by a first thickness comprises endpoint detection.

12. The method of claim 10, wherein said first and second removing said copper layer are performed using a same chemical solution.

13. The method of claim 10, wherein said first and second removing said copper layer comprises exposing said layer of copper to a $H_2SO_4$ solution.

14. The method of claim 10, wherein said first and second removing said copper layer comprises exposing said layer of copper to a $H_3PO_4$ solution.

15. The method of claim 10, further comprising applying a layer of copper seed material prior to said depositing a layer of copper over said layer of dielectric.

16. The method of claim 10, wherein said layer of copper comprises doped copper having a doping agent.

17. The method of claim 16, wherein said doping agent is Ti, Zr, Zn, Sn or Mg.

18. A method of removing copper, comprising the steps of:

providing a substrate, the substrate having been provided with a layer of dielectric over the surface thereof, a pattern of openings having been created in said layer of dielectric;

depositing a layer of copper over said layer of dielectric and in said openings;

first removing said layer of copper by applying electropolish to said layer of copper, leaving a layer of copper having a thickness between about 150 and 1000 Angstrom in place over the unpatterned portion of the dielectric layer; and second removing said layer of copper over the unpatterned portion of the dielectric layer by applying chemical etchback to said layer of copper.

19. The method of claim 18, wherein said first removing said layer of copper comprises endpoint detection.

20. The method of claim 18, wherein said first removing and said second removing comprises exposing said layer of copper to a $H_2SO_4$ solution.

21. The method of claim 18, wherein said first removing and said second removing comprises exposing said layer of copper to a $H_3PO_4$ solution.

22. The method of claim 18, further applying a layer of copper seed material prior to said depositing a layer of copper over said layer of dielectric.

23. The method of claim 18, wherein said layer of copper comprises doped copper having a doping agent.

24. The method of claim 23, wherein said doping agent is Ti, Zr, Zn, Sn or Mg.

25. A method of removing copper, comprising the steps of:

providing a substrate, the substrate having been provided with a layer of dielectric over the surface thereof, a pattern of openings having been created in said layer of dielectric;

depositing a layer of copper over said layer of dielectric and in said openings;

applying electropolish to said layer of copper by exposing said layer of copper to a solution of $H_3PO_4$ or $H_2SO_4$, leaving a second layer of copper having a thickness between about 150 and 1,000 Angstrom in the unpatterned portion of the dielectric layer in place; and applying chemical etchback to said second layer of copper by exposing said second layer of copper to a solution of $H_3PO_4$ or $H_2SO_4$, removing said layer of copper from said unpatterned portion of the layer of dielectric.

26. The method of claim 25, wherein said applying electropolish to said layer of copper comprises endpoint detection.

27. The method of claim 25, further applying a layer of copper seed material prior to said depositing a layer of copper over said layer of dielectric.

28. The method of claim 25, wherein said layer of copper comprises doped copper having a doping agent.

29. The method of claim 28, wherein said doping agent is Ti, Zr, Zn, Sn or Mg.

30. A method of forming patterned copper conductors on a substrate, comprising:

forming a pattern of trenches in a dielectric layer on a substrate;

depositing copper over the untrenched portions of the dielectric layer and over the trenches;

electropolishing the substrate to partially remove the deposited copper, until between about 150 and 1000 Angstroms of copper remaining over the untrenched portions of the dielectric layer; and chemically etching the substrate to remove the remaining deposited copper over the untrenched portions of the dielectric layer.

31. The method of claim 30, wherein electropolishing until between about 150 and 1000 Angstroms of copper remain comprises controlling an electropolish current for a first timed interval.

32. The method of claim 30, wherein the electropolishing of the substrate and the chemical etching of the substrate are both performed while the substrate is immersed in the same chemical solution.

33. The method of claim 32, wherein the chemical solution is selected from the group of solutions consisting of an $H_2SO_4$ solution and an $H_3PO_4$ solution.

34. The method of claim 31, further comprising timing the chemical etching for a second timed interval to determine when to cease chemical etching.

35. The method of claim 34, wherein the etch rate of the chemical etching is controlled by controlling the etch temperature.

36. The method of claim 33, wherein the chemical solution further comprises citric acid at a concentration below 10,000 parts per million.

37. The method of claim 30, wherein the etch rate of the chemical etching is between about 20 nanometers/minute and 60 nanometers/minute.

38. The method of claim 30, wherein the copper is a copper alloy.

39. The method of claim 38, wherein the copper alloy comprises copper alloyed with at least one metal selected from the group consisting of Ti, Zr, Zn, Sn, and Mg, and combinations thereof.

40. The method of claim 30, wherein depositing copper comprises applying a copper seed material over the dielectric and the trenches and electroplating copper over the seed material.

* * * * *